United States Patent
Hsu

(10) Patent No.: US 7,154,053 B2
(45) Date of Patent: Dec. 26, 2006

(54) OPTOELECTRONIC PACKAGE WITH WIRE-PROTECTION LID

(75) Inventor: Chain-Hau Hsu, Kaohsiung (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 0 days.

(21) Appl. No.: 11/358,408

(22) Filed: Feb. 22, 2006

(65) Prior Publication Data

US 2006/0201708 A1   Sep. 14, 2006

(30) Foreign Application Priority Data

Feb. 23, 2005   (TW) .............................. 94105474 A

(51) Int. Cl.
*H05K 5/06*   (2006.01)
*H01L 23/02*  (2006.01)

(52) U.S. Cl. ................ 174/564; 174/560; 257/681

(58) Field of Classification Search ................ 174/560, 174/564; 257/680, 681
See application file for complete search history.

(56) References Cited

U.S. PATENT DOCUMENTS

| | | | |
|---|---|---|---|
| 5,635,672 A * | 6/1997 | Kawaura | 174/564 |
| 6,111,199 A * | 8/2000 | Wyland et al. | 174/18 |
| 6,365,833 B1 * | 4/2002 | Eng et al. | 174/538 |
| 6,809,852 B1 | 10/2004 | Tao et al. | |
| 6,956,283 B1 * | 10/2005 | Peterson | 257/680 |
| 2002/0023765 A1 * | 2/2002 | Sugiura et al. | 174/52.2 |

* cited by examiner

*Primary Examiner*—Hung V. Ngo
(74) *Attorney, Agent, or Firm*—Rabin & Berdo, P.C.

(57) ABSTRACT

An optoelectronic package with a wire-protection lid is provided. An active surface of a silicon die includes a light working area. The silicon die is disposed on a substrate and electrically connected to the substrate through a plurality of bonding wires. A glass is disposed on the active surface of the silicon die. A silicon base lid with an opening is located above the substrate and connected to the glass by anodic bonding to mask the bonding wires. In addition, the opening of the silicon base lid is aligned with the light working area of the silicon die.

12 Claims, 4 Drawing Sheets

OPTOELECTRONIC PACKAGE WITH WIRE-PROTECTION LID

CROSS-REFERENCE TO RELATED APPLICATIONS

This non-provisional application claims priority under 35 U.S.C. § 119(a) on Patent Application No(s). 094105474 filed in Taiwan, R.O.C. on Feb. 23, 2005, the entire contents of which are hereby incorporated by reference.

BACKGROUND OF THE INVENTION

1. Field of Invention

The present invention relates to an optoelectronic package, and more particularly, to an optoelectronic package with a wire-protection lid.

2. Related Art

Conventional optic components are manufactured on a semiconductor wafer in bulk, and an optoelectronic package process is carried out after the wafer is cut into dies. Since bonding wires are generally used to electrically connect the dies to the substrate in the conventional optoelectronic package process, appropriate protection of the bonding wires is required. Recently, a method for protecting the bonding wire of an optoelectronic package is to protect the bonding wires by sealing them with a molding compound formed by molding.

Referring to FIG. 1, a conventional optoelectronic package 1 mainly includes a substrate 10, a silicon die 20, a glass 30, a plurality of bonding wires 40, and a molding compound 50. The silicon die 20 has an active surface 21 with a plurality of optical elements, e.g., micro-mirror structures, formed in its light working area 22, and a plurality of pads 23 are disposed at the edge of the active surface 21. Further, the glass 30 is fixed on the active surface 21 of the silicon die 20 through an annular block 60, for protecting the light working area 22. After the silicon die 20 is disposed on a top surface 11 of the substrate 10, the bonding wires 40 are formed by wiring to electrically connect the pads 23 of the silicon die 20 and the substrate 10. The molding compound 50 is formed by molding, to protect the bonding wires 40 by sealing them. However, the wire collapse and short circuit easily occur to the bonding wires 40 due to the molding pressure of the molding compound 50. Moreover, the molding compound 50 may overflow to the glass 30, or the light working area 22 of the silicon die 20 may be contaminated by the overflow of the molding compound 50, since the block 60 is broken due to the excessive molding pressure of the molding compound 50, such that the operation of the optical elements in the light working area 22 fails.

Another conventional method for protecting bonding wires of an optoelectronic package utilizes hermetically sealing, which is disclosed in, for example, U.S. Pat. No. 6,809,852, wherein a die is disposed on a substrate, and micro-mirror structures are disposed on a glass carrier (or referred as glass die) on the die, to form an optical cell. The die and the substrate are electrically connected with bonding wires. Further, a ring is disposed on the substrate, and a transparent lid made of e.g., glass is patched on the ring, to hermetically seal the bonding wires. However, such a bonding wire protection method cannot ensure the transparent lid to be parallel to the active surface of the die and the glass carrier, therefore, when the light or image passes through the transparent lid and the glass carrier, the risks of light refraction, scattering, and defocusing will be increased, thereby the quality of the optoelectronic package is deteriorated.

SUMMARY OF THE INVENTION

An object of the present invention is to provide an optoelectronic package with a wire-protection lid, which mainly includes a substrate, a silicon die disposed on the substrate, a glass disposed on the silicon die, a plurality of bonding wires used for electrically connecting the substrate and the silicon die, and a silicon base lid with an opening. The silicon base lid is connected to the glass by anodic bonding to mask and protect the bonding wires. In addition, the opening of the silicon base lid is aligned with a light working area of the silicon die, to ensure a desirable light path. As for the optoelectronic package with wire-protection lid of the present invention, problems such as wire collapse and short circuit of the bonding wires due to forming the molding compound with molding can be avoided, thus the quality of the optoelectronic package is improved.

Another object of the present invention is to provide an optoelectronic package with a wire-protection lid. A silicon base lid has an opening and a recess, wherein the opening is communicated with a bottom surface of the recess, and the silicon base lid is connected to a glass on a silicon die by anodic bonding, such that the recess of the silicon base lid masks a plurality of bonding wires used for electrically connecting a substrate and the silicon die. The optoelectronic package with wire-protection lid of the present invention needs no rings to be disposed on the substrate, thus the components of the optoelectronic package are reduced.

Yet another object of the present invention is to provide an optoelectronic package with a wire-protection lid. An active surface of a silicon die includes a light working area, and a glass disposed on the silicon die has a surface bonding area surrounding the light working area, for connecting a silicon base lid by anodic bonding, such that an anodic bonding layer on the surface bonding area does not mask the light working area of the die, so as to avoid influencing the light path.

The optoelectronic package with a wire-protection lid according to the present invention mainly includes a substrate, a silicon die, a glass, a plurality of bonding wires, and a silicon base lid, wherein the silicon die with an active surface is disposed on the substrate, and the active surface includes a light working area; the glass is disposed on the active surface of the silicon die; the bonding wires are used to electrically connect the silicon die and the substrate; and the silicon base lid is disposed on the substrate and is connected to the glass by anodic bonding, to mask and protect the bonding wires, and the silicon base lid has an opening aligned with the light working area of the silicon die.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and which thus is not limitative of the present invention, and wherein.

DETAILED DESCRIPTION OF THE INVENTION

Figure 1:
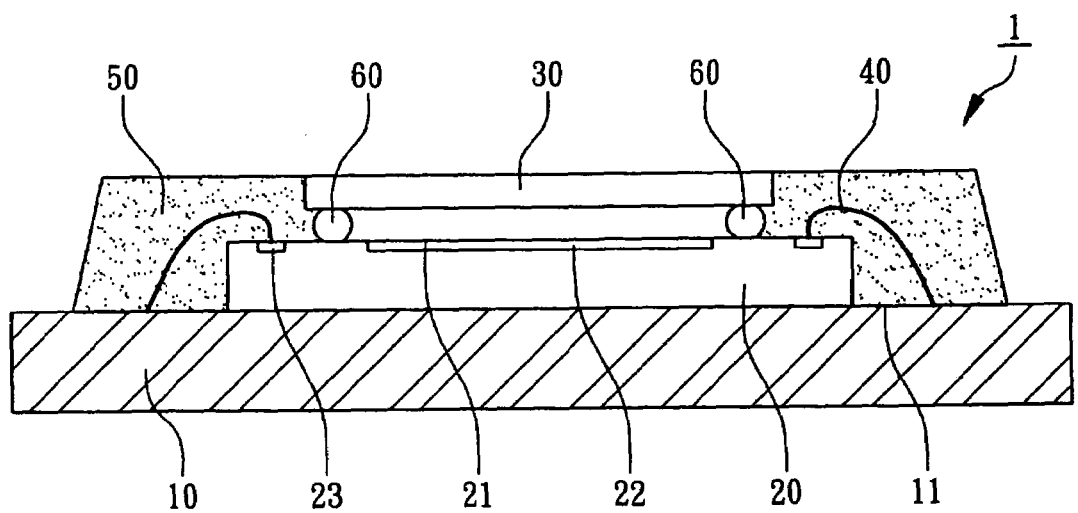
FIG. 1 is a schematic cross-sectional view of a conventional optoelectronic package.
Figure 2:
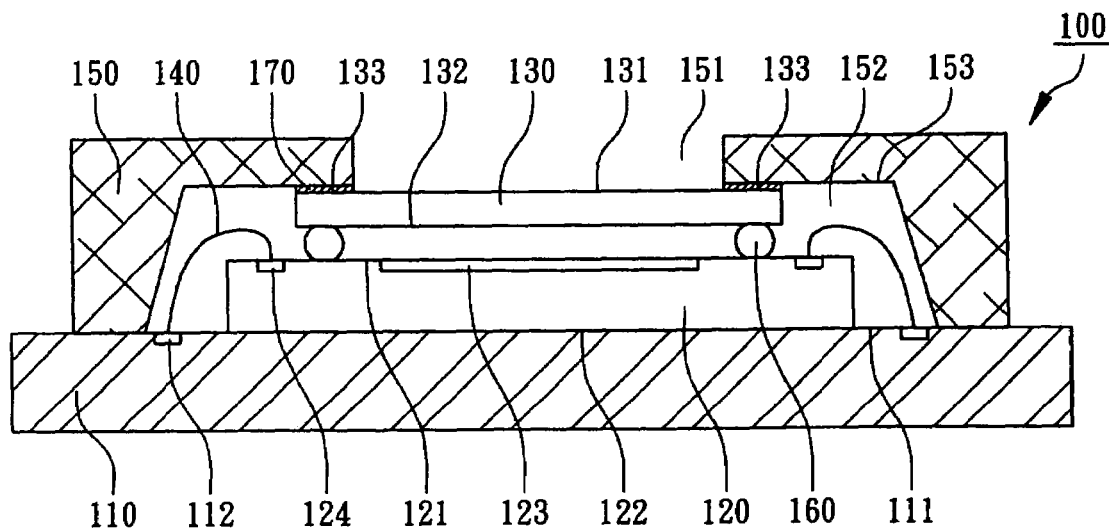
FIG. 2 is a schematic cross-sectional view of an optoelectronic package with a wire-protection lid according to a first embodiment of the present invention.
Figure 3:
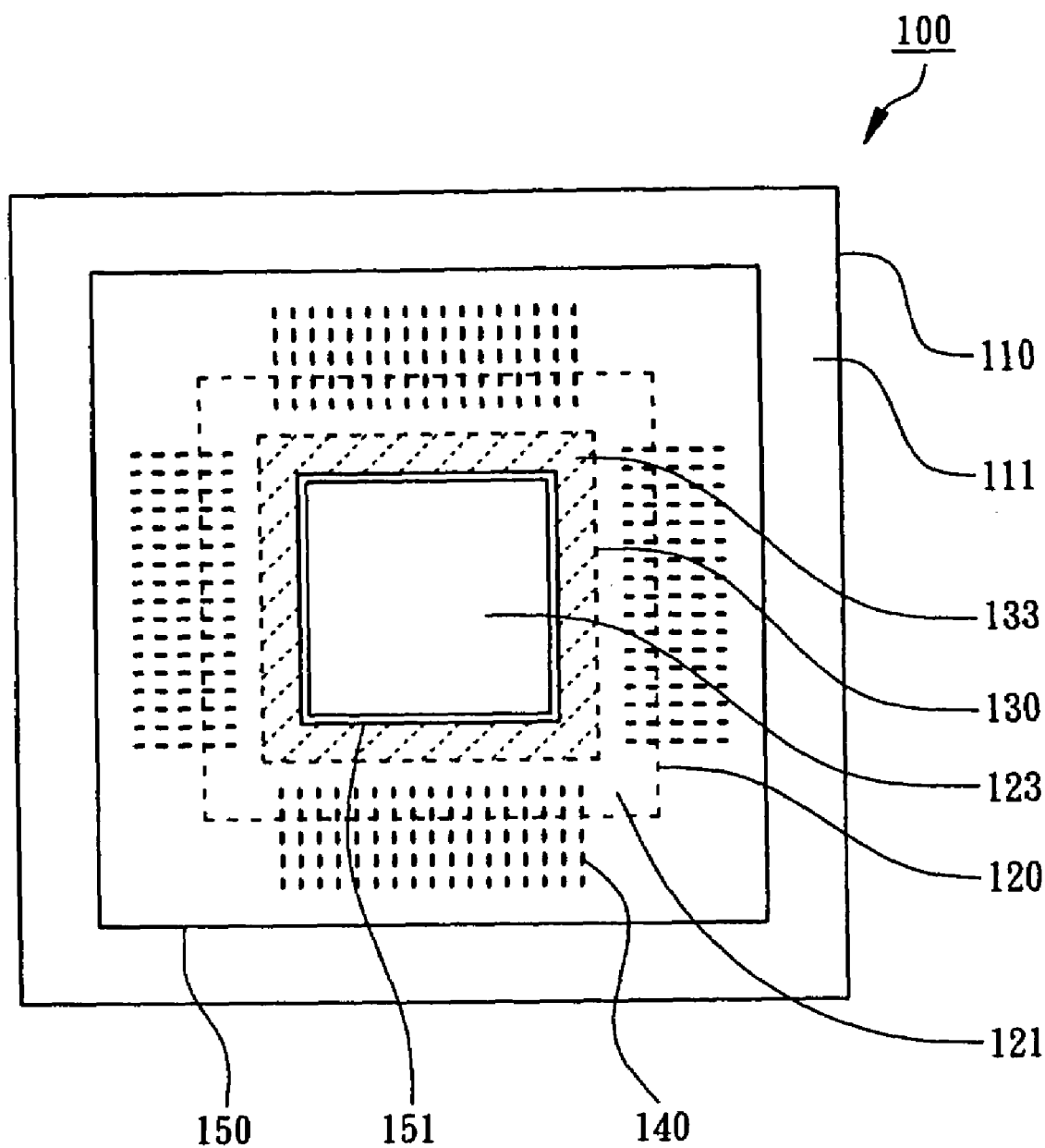
FIG. 3 is a top view of the optoelectronic package according to the first embodiment of the present invention.

In a first embodiment of the present invention, FIG. 2 is a schematic cross-sectional view of an optoelectronic package 100 with a wire-protection lid, and FIG. 3 is a top view of the optoelectronic package 100. Referring to FIG. 2, the optoelectronic package 100 mainly includes a substrate 110, a silicon die 120, a glass 130, a plurality of bonding wires 140, and a silicon base lid 150, wherein the substrate 110 has a top surface 111 with a plurality of connecting pads 112 being formed thereon. The substrate 110 can be a ceramic circuit board or another chip carrier.

The silicon die 120 has an active surface 121 and a back surface 122, wherein the active surface 121 includes a light working area 123 formed with a plurality of optical elements (not shown), and a plurality of pads 124 is formed on the active surface 121, and is disposed on other areas outside the light working area 123, for example, the edge area of the active surface 121. In the present embodiment, the silicon die 120 is a micro electro mechanical system die (MEMS die), and the optical elements in the light working area 123 can be a plurality of micro mirror structure arrays, or alternatively, the micro mirror structures can be formed on the glass 130. Therefore, the combination of the silicon die 120 and the glass 130 can be applied to a digital micro-mirror device (DMD) of a digital light process (DLP).

The glass 130 with a top surface 131 and a bottom surface 132 is disposed on the active surface 121 of the silicon die 120. In the present embodiment, the glass 130 is a glass die, and should not cover the pads 124 of the silicon die 120. The glass 130, e.g., glass die, can be patched on a wafer (not shown) containing multiple silicon dies 120 when being in a wafer form, and be divided into a plurality of die combinations, each consisting of the silicon die 120 and the glass 130, so as to form an optical cell. In the present embodiment, an annular block 160 can be formed between the active surface 121 of the silicon die 120 and the bottom surface 132 of the glass 130, for adhering the glass 130 onto the active surface 121 of the silicon die 120, thus providing an internal space for protecting the optical elements. Moreover, the glass 130 has a surface bonding area 133 surrounding the light working area 123, for connecting to the silicon base lid 150 by anodic bonding.

The back surface 122 of the silicon die 120 is patched on the top surface 111 of the substrate 110, and the bonding wires 140 formed through wiring are used to electrically connect the pads 124 of the silicon die 120 and the connecting pads 112 of the substrate 110. Generally, the bonding wires 140 are gold wires, but other metal bonding wires or electrical connection elements also can be used.

The silicon base lid 150 with an opening 151 is disposed on the top surface 111 of the substrate 110. The silicon base lid 150 is connected to the glass 130 by anodic bonding, to mask the bonding wires 140. In addition, the opening 151 of the silicon base lid 150 is aligned with the light working area 123 of the silicon die 120. The size of the opening 151 should be slightly larger than that of the light working area 123 of the silicon die 120 and smaller than that of the glass 130. In the present embodiment, the silicon base lid 150 has a recess 152 used for accommodating the silicon die 120, the glass 130, and the bonding wires 140, and masking the bonding wires 140. The opening 151 is communicated with a bottom surface 153 of the recess 152, and it is aligned with the light working area 123 of the silicon die 120. After the process of anodic bonding, an anodic bonding layer 170 is formed between the bottom surface 153 of the recess 152 of the silicon base lid 150 and the surface bonding area 133 of the glass 130, such that the anodic bonding layer 170 does not mask the light working area 123 of the silicon die 120, so as to avoid influencing the light path. Therefore, as for the optoelectronic package 100 with wire-protection lid, the ring as disclosed in the prior art is not required to be disposed on the substrate 110, thus the components of the optoelectronic package are reduced.

Figure 4:
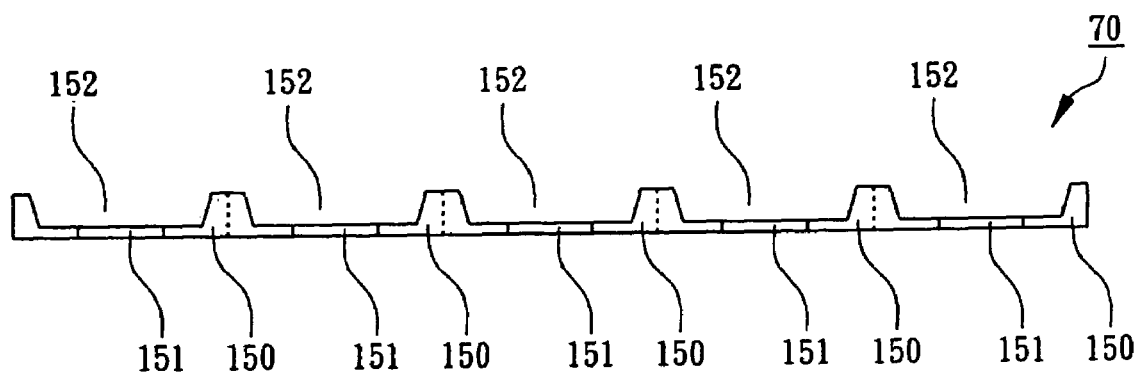
FIG. 4 is a schematic cross-sectional view of the silicon base lid of the optoelectronic package during the wafer process according to the first embodiment of the present invention.

Referring to FIG. 4, the method for manufacturing the silicon base lid 150 is illustrated as follows. First, a silicon wafer 70 is provided. Then, a half etching process is carried out, such that the silicon wafer 70 is formed with a plurality of recesses 152. Next, a plurality of openings 151 is formed corresponding to each recess 152 through a laser or chemical etching technique, to penetrate the silicon wafer 70. Thereafter, a wafer sawing process is carried out to form a plurality of silicon base lids 150.

Figure 5:
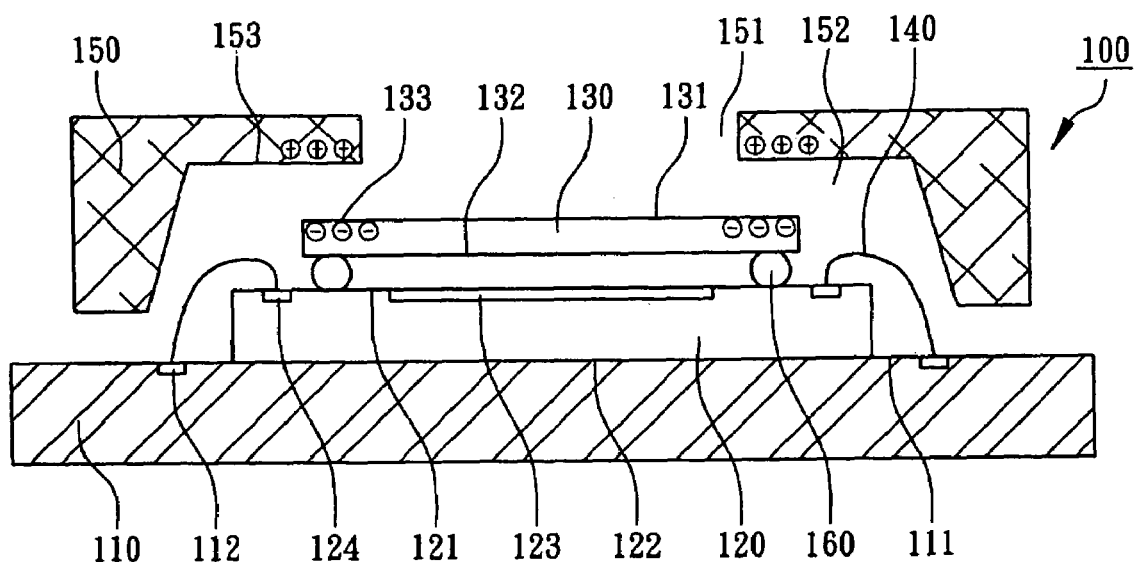
FIG. 5 is a schematic cross-sectional view of the optoelectronic package during the anodic bonding process according to the first embodiment of the present invention.

Referring to FIG. 5, it is a schematic cross-sectional view of the optoelectronic package 100 during the anodic bonding process. When the silicon base lid 150 is anodic bonded to the glass 130, the silicon base lid 150 is conductively connected to the anode of an anodic binding machine (not shown), and the glass 130 is conductively connected to the cathode of the anodic bonding machine, and a direct current voltage, about 500 to 1000 volts, is applied by the anodic bonding machine, and the ambient temperature is raised to 300 to 500° C. When the temperature rises, the positively-charged sodium ions in the glass 130 are attracted by the cathode of the anodic bonding machine so as to move, and the negatively-charged oxygenic ions are attracted by the silicon base lid 150 connecting the anode to move towards the surface bonding area 133 of the glass 130, such that the glass 130 and the silicon base lid 150 react to generate there-between an anodic bonding layer 170 with silicon dioxide. The anodic bonding layer 170 with strong bond strength is capable of firmly bonding the silicon base lid 150 and the glass 130, so as to mask the bonding wires 140.

Therefore, the optoelectronic package 100 of the present invention utilizes the silicon base lid 150 to be anodically bonded to the glass 130, so as to mask the bonding wires 140, and the opening 151 of the silicon base lid 150 is aligned with the light working area 123 of the silicon die 120, thus it is unnecessary to seal and protect the bonding wires 140 with the molding compound formed by molding. Therefore, the problems of wire collapse and short circuit caused by the molding compound will not occur, and a desirable light path can be ensured to efficiently improve the quality of the optoelectronic package.

Figure 6:
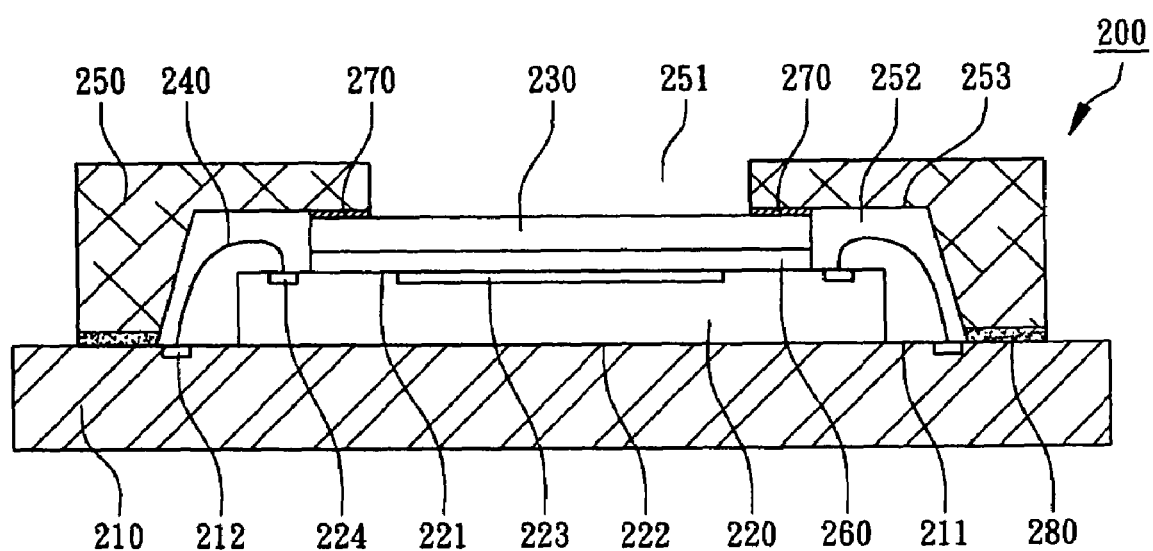
FIG. 6 is a schematic cross-sectional view of an optoelectronic package with a wire-protection lid according to a second embodiment of the present invention.

In a second embodiment of the present invention, referring to FIG. 6, an optoelectronic package 200 with a wire-protection lid can be applied to various forms of optoelectronic products, which mainly includes a substrate 210, a silicon die 220, a glass 230, a plurality of bonding wires 240, and a silicon base lid 250. The substrate 210 has a top surface 211 with a plurality of connecting pads 212 being formed thereon.

The silicon die 220 has an active surface 221 and a back surface 222. The active surface 221 of the silicon die 220 includes a light working area 223, and a plurality of pads 224 is formed on the active surface 221. In the present embodiment, the silicon die 220 is an image sensor chip, and the light working area 223 is formed with a plurality of image sensor elements (not shown).

In the present embodiment, the glass 230 is adhered and connected to the active surface 221 of the silicon die 220 with a transparent adhesive 260. The silicon die 220 is disposed on the top surface 211 of the substrate 210, and the bonding wires 240 are used to connect the pads 224 of the silicon die 220 and the connecting pads 212 of the substrate 210.

The silicon base lid 250 has an opening 251; preferably, it further has a recess 252. The opening 251 is communicated with a bottom surface 253 of the recess 252. The bottom surface 253 of the recess 252 of the silicon base lid 250 is connected to the glass 230 by anodic bonding so as to form an anodic bonding layer 270. The opening 251 of the silicon base lid 250 is aligned with the light working area 223 of the silicon die 220, to provide a desirable light sensing path. Preferably, a seal material 280 is used to connect the silicon base lid 250 to the top surface 211 of the substrate 210, such that the recess 252 acts as a hermetic space for hermetically sealing the bonding wires 240, instead of using the conventional molding compound for sealing the bonding wires.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An optoelectronic package, comprising:
   a substrate;
   a silicon die, disposed on the substrate, wherein the silicon die has an active surface containing a light working area;
   a glass, disposed on the active surface of the silicon die;
   a plurality of bonding wires, for electrically connecting the silicon die and the substrate; and
   a silicon base lid, located above the substrate and connecting to the glass by anodic bonding to mask the bonding wires, and the silicon base lid having an opening aligning with the light working area of the silicon die.

2. The optoelectronic package as claimed in claim 1, wherein the silicon base lid has a recess, and the opening of the silicon base lid is communicated with a bottom surface of the recess.

3. The optoelectronic package as claimed in claim 2, wherein the glass has a surface bonding area surrounding the light working area, and an anodic bonding layer is formed between the bottom surface of the recess of the silicon base lid and the surface bonding area of the glass.

4. The optoelectronic package as claimed in claim 1, wherein the glass has a surface bonding area surrounding the light working area for anodic bonding.

5. The optoelectronic package as claimed in claim 1, wherein the silicon die is a micro electro mechanical system (MEMS) die.

6. The optoelectronic package as claimed in claim 1, wherein the glass is a glass die.

7. The optoelectronic package as claimed in claim 5, wherein the glass is a glass die.

8. The optoelectronic package as claimed in claim 1, wherein the silicon die is an image sensor chip.

9. The optoelectronic package as claimed in claim 1, wherein the substrate is a ceramic circuit board.

10. The optoelectronic package as claimed in claim 1, further comprising a seal material used for connecting the silicon base lid and the substrate, so as to hermetically seal the bonding wires.

11. The optoelectronic package as claimed in claim 1, further comprising a block for connecting the silicon die and the glass.

12. The optoelectronic package as claimed in claim 1, further comprising a transparent adhesive for connecting the silicon die and the glass.

* * * * *